(12) United States Patent
Williamson et al.

(10) Patent No.: US 12,243,835 B2
(45) Date of Patent: Mar. 4, 2025

(54) PACKAGE SUBSTRATE WITH CTE MATCHING BARRIER RING AROUND MICROVIAS

(71) Applicant: Texas Instruments Incorporated, Dallas, TX (US)

(72) Inventors: Jaimal Mallory Williamson, McKinney, TX (US); Guangxu Li, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 431 days.

(21) Appl. No.: 17/679,082

(22) Filed: Feb. 24, 2022

(65) Prior Publication Data
US 2022/0254735 A1    Aug. 11, 2022

Related U.S. Application Data

(62) Division of application No. 16/205,436, filed on Nov. 30, 2018, now Pat. No. 11,270,955.

(51) Int. Cl.
*H01L 23/00* (2006.01)
*H01L 21/48* (2006.01)
*H01L 23/498* (2006.01)

(52) U.S. Cl.
CPC ........ *H01L 23/562* (2013.01); *H01L 21/4857* (2013.01); *H01L 21/486* (2013.01); *H01L 23/49822* (2013.01); *H01L 23/49827* (2013.01)

(58) Field of Classification Search
CPC . H01L 23/562; H01L 21/4857; H01L 21/486; H01L 23/49822; H01L 23/49827
See application file for complete search history.

(56) References Cited

U.S. PATENT DOCUMENTS

| 5,378,927 | A  | 1/1995 | McAllister et al. |
| 7,217,651 | B2 | 5/2007 | Sir et al. |
| 7,394,159 | B2 | 7/2008 | Goto et al. |
| 7,402,515 | B2 | 7/2008 | Arana et al. |
| 7,777,136 | B2 | 8/2010 | Egitto et al. |

(Continued)

OTHER PUBLICATIONS

Birch, "Reliablility testing for microvias in printed wire board", Article in Circuit World—Nov. 2009 (Year: 2009).

(Continued)

*Primary Examiner* — Yasser A Abdelaziez
(74) *Attorney, Agent, or Firm* — Ronald O. Neerings; Frank D. Cimino (57) ABSTRACT

A multi-layer package substrate includes a first build-up layer including a first dielectric layer and at least a second build-up layer including a second dielectric layer on the first build-up layer. The second build-up layer includes a top metal layer with a surface configured for attaching at least one integrated circuit (IC) die. The first build-up layer includes a bottom metal layer and a first microvia extending through the first dielectric layer, and the second build-up layer includes at least a second microvia extending through the second dielectric layer that is coupled to the first microvia. A barrier ring that has a coefficient of thermal expansion (CTE) matching material relative to a CTE of a metal of the second microvia positioned along only a portion of a height of at least the second microvia including at least around a top portion of the second microvia.

19 Claims, 5 Drawing Sheets

(56) References Cited

U.S. PATENT DOCUMENTS

| | | | |
|---|---|---|---|
| 7,956,443 B2 | 7/2011 | Akram et al. | |
| 8,440,916 B2 | 5/2013 | Li et al. | |
| 9,245,795 B2 | 1/2016 | Boyapati et al. | |
| 9,281,269 B2 | 3/2016 | Williamson et al. | |
| 9,536,837 B2 | 1/2017 | Lamy | |
| 10,211,143 B2 | 2/2019 | Tanikella | |
| 10,249,561 B2 | 4/2019 | Ishihara | |
| 2002/0088116 A1 | 7/2002 | Milkovich et al. | |
| 2002/0140105 A1 | 10/2002 | Higgins, III et al. | |
| 2004/0113278 A1 | 6/2004 | Dalton et al. | |
| 2006/0289202 A1 | 12/2006 | Takeuchi et al. | |
| 2008/0111250 A1 | 5/2008 | Melville et al. | |
| 2009/0002958 A1* | 1/2009 | Li | H05K 3/0032 |
| | | | 361/748 |
| 2009/0189289 A1 | 7/2009 | Kacker et al. | |
| 2011/0215480 A1 | 9/2011 | Gorczyca et al. | |
| 2013/0119555 A1 | 5/2013 | Sundaram et al. | |
| 2014/0262440 A1 | 9/2014 | Kim et al. | |
| 2016/0111380 A1 | 4/2016 | Sundaram et al. | |
| 2016/0133562 A1* | 5/2016 | Lee | H01L 21/481 |
| | | | 438/126 |
| 2017/0040283 A1 | 2/2017 | Lin et al. | |
| 2017/0358528 A1 | 12/2017 | Darmawikarta et al. | |
| 2017/0367185 A1 | 12/2017 | Roessler | |
| 2018/0190606 A1 | 7/2018 | Williamson et al. | |
| 2018/0294213 A1 | 10/2018 | Aoki et al. | |
| 2019/0067211 A1* | 2/2019 | Lee | H01L 21/4857 |
| 2019/0139785 A1* | 5/2019 | Lee | H01L 21/50 |
| 2021/0159153 A1 | 5/2021 | Takano et al. | |
| 2021/0159171 A1 | 5/2021 | Wang et al. | |

OTHER PUBLICATIONS

Reza Ghaffarian, Ph.D.; "Reliability of PWB Microvias for High Density Package Assembly", Body of Knowledge (BOK); Jet Propulsion Laboratory, California Institute of Technology, NASA Electronic Parts and Packaging Program (NEPP); Jun. 2006 (Year:2006).

Yan Ning, "Reliablity of Cooper Filled Stacked Micronvias in High Density Interconnect Circuit Boards", Dissertation submitted to the Faculty of the Graduate School of the University of Maryland, College Park, Maryland, in partial fulfillment of the requirements for the degree of Doctor of Philosophy (Year: 2017).

* cited by examiner

FIG. 5C

PACKAGE SUBSTRATE WITH CTE MATCHING BARRIER RING AROUND MICROVIAS

This application is a Divisional of application Ser. No. 16/205,436 filed Nov. 30, 2018.

FIELD

This Disclosure relates to package substrates having microvias for semiconductor devices.

BACKGROUND

A variety of integrated circuit (IC) chip packages are known that provide support for at least one IC die to enable the mounting of the IC die and its interconnection to a printed circuit board (PCB). In fabricating an IC package, the IC die(s) may be placed on a package substrate to form an IC package. One common IC package arrangement comprises a semiconductor die flipchip (FC) mounted to top side land pads of a package substrate that has microvia connections from the top said land pads to the bottom side of the package substrate, where the bottom side of the package substrate is typically connected to land pads on a printed circuit board (PCB).

One type of package substrate commonly used in fabricating IC packages is a single-core organic package substrate. Single-core organic package substrates include a single organic core layer comprising an organic material and one or more build-up layers formed on the top and/or below the organic core layer. Coreless package substrates are also known that comprise all build-up layers that alternate between metal layers and dielectric layers. Connections through the dielectric layers are provided by metal filled vias known as microvias which may be drilled then filled. The build-up layer(s) provide interconnectivity for I/O, power, configuration information. For example, FC ball grid array (BGA) devices may use build-up substrate technology with microvias to provide connections through the various dielectric layers.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize stress and strain is created in package substrates particularly during heat steps by the coefficient of thermal expansion (CTE) mismatch between dissimilar materials of the metal in the microvias formed within organic dielectric layers (e.g., Bismaleimide-Triazine (BT)-epoxy comprising a BT resin mixed with an epoxy resin) of a package substrate, such as at the top corner interface of the organic dielectric layer around the metal microvia. Package assembly processing involving significant heating such as solder reflow and/or temperature cycling can cause microvia cracking in the organic dielectric layer around the microvia.

The dielectric material of the organic dielectric layer surrounding the microvia can have a significantly higher CTE as compared to the microvia metal which generally comprises copper (Cu), such as a ACTE at least 17 ppm/° C., which can cause stress and strain and eventual cracking in the dielectric material around the microvia when the in-process package is subjected to temperature cycling or multiple solder reflows associated with conventional assembly and surface mount (SMT) processing. For one specific example, a typical reflow temperature range for Pb-Free (Sn/Ag) solder for flipchip die attach to the top surface of the package substrate or for attachment of the bottom side of a package substrate to a PCB can be 240 to 250° C. with 25 to 90 seconds over 221° C. The reliability of microvias connecting layers within a flipchip package substrate is generally important for signal integrity. When the dielectric material around a microvia cracks or is otherwise compromised such as by delaminating, the signal integrity can be degraded as well, and there can be a degradation in the overall packaged device's performance.

Disclosed package substrates solve this problem by replacing a ring of the dielectric material in the dielectric layer around the microvia at the high stress location(s), such as at corner locations, with a barrier ring of better CTE matching material relative to the metal of the microvia. Disclosed barrier rings thus mitigate the stress and strain generated from package assembly processing including solder reflow and temperature cycling.

A disclosed multi-layer package substrate includes a first build-up layer including a first dielectric layer and at least a second build-up layer including a second dielectric layer on the first build-up layer. The second build-up layer includes a top metal layer including a surface configured for attaching at least one IC die. The first build-up layer includes a bottom metal layer and a first microvia extending through the first dielectric layer, and the second build-up layer includes at least a second microvia extending through the second dielectric layer that is coupled (e.g. stacked or staggered) to the first microvia. A barrier ring that has a CTE matching material relative to a CTE of a metal of the second microvia is positioned along only a portion of a height of at least the second microvia including at least around a top portion of the second microvia. Disclosed barrier rings can shift stress from the high stress corner of the microvia to the bulk of the microvia where stress can be distributed better.

BRIEF DESCRIPTION OF THE DRAWINGS

Reference will now be made to the accompanying drawings, which are not necessarily drawn to scale, wherein.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Due to the CTE mismatch of the metal in the microvias and the dielectric material of the dielectric layer surrounding microvia, a maximum stress is created around microvias in the topmost dielectric layer, particularly for microvias at corners under a FC die in a standard FC BGA substrate configuration. For example, there is a CTE mismatch of about 22 ppm/° C. between a commonly used organic-based dielectric material called AJINOMOTO BUILD-UP FILM (ABF) GX-92 from the Ajinomoto Fine-Techno Co., Inc. which has a CTE of about 39 ppm/° C., and Cu metal which has a CTE of about 17 ppm/° C. ABF may include one or more of an epoxy with a phenol hardener, cyanate ester with an epoxy, and cyanate ester with thermosetting olefin. It is recognized in this Disclosure that the dielectric layer(s) is one of the most important factors affecting microvia reliability of package substrates, where keeping the CTE of the region around the microvia closely matched to the metal of the microvia increases the reliability of the packaged device.

A disclosed concept is to replace the dielectric material of the dielectric layer in contact with the microvia (e.g. Cu-filled) at high stress corner interfaces with a metal layer with a barrier ring comprising a CTE matching material that reduces the stress in the dielectric layer at this recognized important interface. The barrier ring can distribute the CTE-induced stress away from the edge of the microvia into the bulk of the microvia creating a new path to absorb stress. The CTE matching material for the barrier ring has a CTE matching the CTE of the metal of the microvias, generally being within 5 ppm/° C. of the CTE of the metal of the microvias, and the barrier ring can comprise the same material as the microvia material (e.g., both copper) which will thus inherently provide a CTE match of <1 ppm/° C.

Figure 1A:
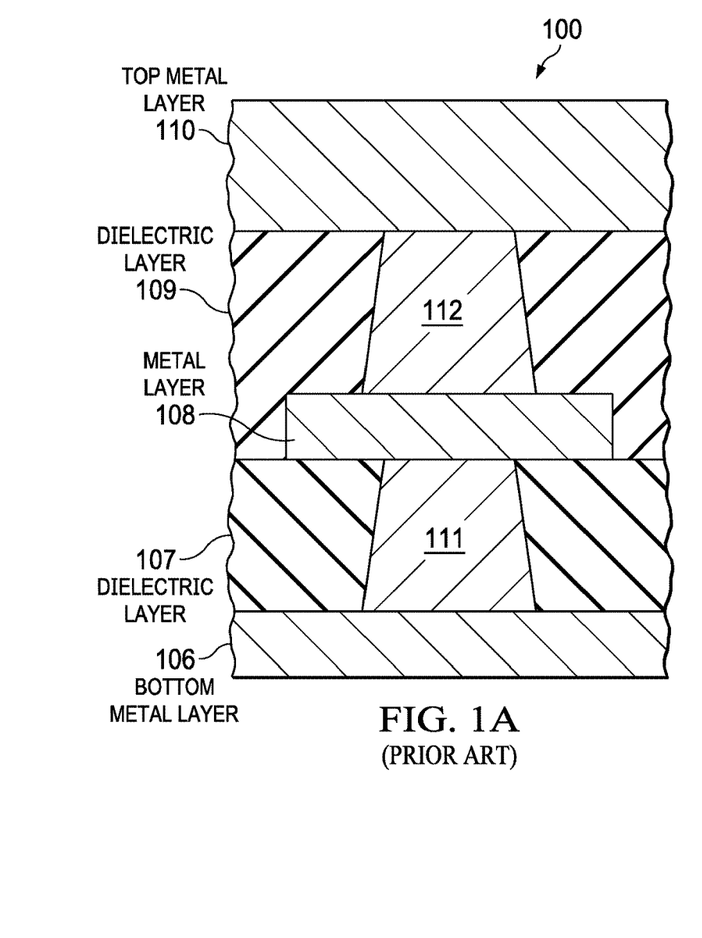
FIG. 1A is a cross sectional depiction of a conventional package substrate having 2 dielectric layers that has a known microvia connection.

FIG. 1A is a cross sectional depiction of a conventional package substrate 100 having 2 dielectric build-up layers that has a known stacked microvia connection comprising a microvia 112 formed in dielectric layer 109 over a microvia 111 formed in dielectric layer 107, where the microvias 111, 112 are coupled together by a trace of a metal layer 108. There is a trace of a top metal layer 110 on top of the microvia 112, and a trace of a bottom metal layer 106 under the microvia 111. For example, the dielectric layers can be about 30 μm thick, and the metal layers can be about 15 μm thick. The microvias 111, 112 can be seen to be tapered vias that have an area dimension (e.g., a proportional to the diameter squared for a circular cross section) that decreases from the bottom to the top, so that the microvias 111, 112 has their smallest via dimension (e.g., via diameter) at their top.

Figure 1B:
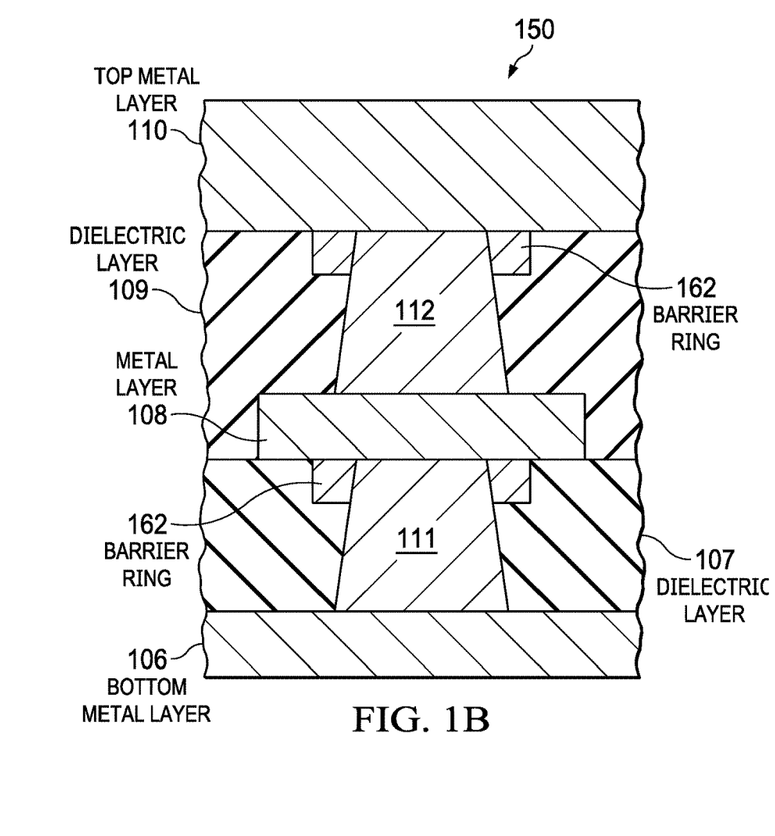
FIG. 1B is a cross sectional depiction of an example package substrate having 2 dielectric layers that has a microvia connection having a disclosed barrier ring at the high stress corner of the microvias.

FIG. 1B is a cross sectional depiction of an example package substrate 150 again as in FIG. 1A shown having 2 dielectric layers that has the microvias 111 and 112 again shown as tapered vias each having a disclosed barrier ring 162 at the top corner which corresponds to the smallest area (based on a smallest diameter of the tapered shown) in its associated dielectric layer 107 and 109, respectively. However, although there are barrier rings 162 shown in both dielectric layers 107, 109, disclosed barrier rings 162 can be in as few as only one of the dielectric layers. A portion of the dielectric layers 107 and 109 normally residing in the top corner is replaced by a barrier ring 162 that is in an annular shape which as described above comprises a CTE matching material relative to the metal material of the microvias 111, 112.

FIGS. 3A-G, 4A-E and 5A-E described below provide example process flows for forming the barrier rings 162. The barrier rings 162 may be referred to as a ring-T structure because from a top down view there is a metal (e.g., copper) ring shown as barrier ring 162 which surrounds the microvias 111 and 112, and from a cross sectional depiction the microvias 111, 112 with their barrier ring 162 have the shape of a "T."

The thickness of the barrier ring 162 can be tailored for reliability performance and aspect ratio. As noted above, the barrier rings 162 can comprise the same material as the metal layers 106, 108 and 110, such as both comprising copper. For example, for a 30 μm thick dielectric layer having 5 μm diameter 30 μm tall microvias 111, 112, the barrier rings 162 can be 2 μm to 8 μm thick with a 7 μm to 15 μm outer diameter, with the inner diameter of the barrier ring 162 extending to the outer diameter wall of the microvia. Although FIG. 1B shows the packaged substrate 150 with only 2 dielectric levels each with microvias that feature 2-level stacked microvias each having barrier rings 162, disclosed barrier rings 162 also apply to staggered microvia arrangements, and package substrates having 3 or more dielectric levels that have 3 or more stacked or staggered microvias, such as the package substrate 210 shown in FIG. 2 described below that has 7 stacked microvias 205.

Figure 2:
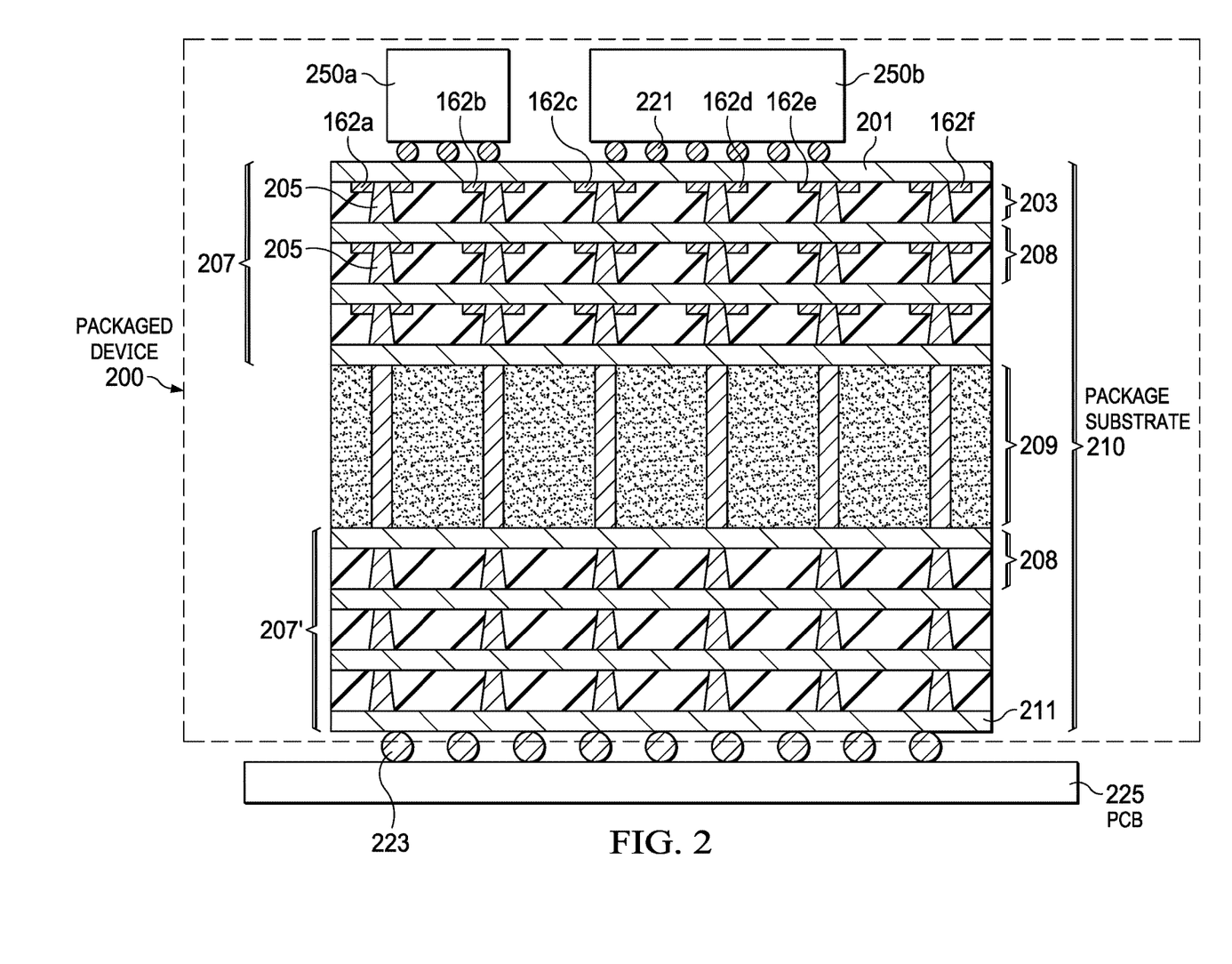
FIG. 2 is a cross-sectional schematic diagram illustrating a packaged FC BGA device on a PCB comprising first IC die and a second IC die on a single-core organic package substrate having build-up layers above and below the core, with the build-up layers on top of the core having disclosed barrier rings in the dielectric build-up layers at the top corners of the microvias.

FIG. 2 is a cross-sectional schematic diagram illustrating a packaged IC device shown as a FC BGA packaged device 200 comprising a package substrate 210 that on its top side has a first IC die 250a and at least a second IC die 250b lateral to the first IC die 250a shown by example as being FC die. The IC die 250a, 250b are attached by bonding features 221 to the top metal build-up layer 201, and the package substrate 210 on its bottom side has its bottom metal layer 211 attached by bonding features 223 to land pads (not shown) on a PCB 225. The die 250a, 250b may also include through silicon vias (TSVs) which enable the IC die to be assembled top side up on to the package substrate 210.

The IC die 250a, 250b may perform different functionalities or may perform the same functionality. The package substrate 210 comprises an organic core 209 such as a fiber core having build-up layers both above and below the core, with the build-up layers on top of the organic core 209 having disclosed barrier rings 162a, 162b, 162c, 162d, 162e, 162f in the dielectric build-up layers at the top corners of the microvias 205, where there are 7 stacked microvias 205 shown. The barrier rings 162a-f can be within 10 mm from under an outer edge of an IC die 250a, 250b, optionally being along the entire perimeter of the IC die 250a, 250b, including directly under an outer edge of the IC die 250a, 250b. Disclosed barrier rings may also be included near corners and edges of the package substrate 210, which are also recognized as being high stress points, such as being located within 10 mm of corners and edges, optionally being along the entire perimeter of the package substrate 210.

Although not shown in FIG. 2, disclosed barrier rings can also be around the microvias 205 below the organic core 209 as this area can also be susceptible to microvia cracking. Although not shown in FIG. 2, underfill that is generally under the IC die 250a, 250b can impact the distribution of stress on the underneath of the die so that microvias below the organic core 209 may be more stress sensitive as compared to microvias above the organic core 209. The bonding features 221 and 223 shown as bumps can comprise solder bumps, or solder capped (e.g., copper) pillars. The bonding features 223 and 221 may also comprise metal (e.g., copper) Cu interconnects.

The build-up layers comprise a first plurality of build-up layers 207 formed on top of the organic core 209, and a second plurality of build-up layers 207' formed below the organic core 209. Each build-up layer 208 of the plurality of build-up layers 207, 207' includes a metal build-up layer and a dielectric build-up layer shown for the top build-up layer as a top metal build-up layer 201 and top dielectric build-up layer 203. The metal build-up layers of the respective build-up layers 208 are connected through microvias 205 formed in the dielectric build-up layers 203. As noted above, the microvias 205 formed in the first plurality of build-up layers 207 include disclosed barrier rings 162 in the dielectric build-up layers 203 at the top corners of the microvias 205.

Additionally, a bottom most metal build-up layer of the second plurality build-up layers 207' shown as bottom metal layer 211 may be connected to the top metal build-up layer 201 of the first plurality of build-up layers 207 by microvias 205 in the organic core 209 which may be a fiber core. The build-up layers 208 provide interconnectivity for IC dies 250a, 250b connected to the package substrate 210 for I/O, power, configuration information, etc. Signals to and from IC dies 250a, 250b connected to the package substrate 210 may be transmitted through the metal build-up layers and microvias 205 in the dielectric build-up layers.

Disclosed barrier rings 162 can generally be applied to any package substrate technology that has a stacked, staggered, or mixed stacked and staggered microvia design. This includes the core containing package substrate 210 shown in FIG. 2, coreless package substrates, and PCBs. Disclosed barrier rings 162 can be particularly advantageous for multiple stacked microvia package substrates, particularly over a dielectric layer top corner within 10 mm from under an outer edge of an IC die. Also, as described above, disclosed barrier rings may also be particularly advantageous when included near corners and edges of the package substrate 210. Although not shown in FIG. 2, the package device 200 may have a lid that functions as a heat spreader which is attached to the IC die 250a, 250b generally by a thermally conductive interface material that is secured beyond the area of the IC die to the PCB 225 by a lid seal adhesive.

A method of fabricating a package substrate comprises forming a pattern of a first photosensitive material (e.g., a dry film resist (DFR)) on a core metal layer (e.g., copper) to form a first dielectric aperture and a second dielectric aperture. The core metal layer is generally a large area core metal sheet (or panel) to enable simultaneously forming a plurality of package substrates. A first metal layer is plated into the first dielectric aperture and into the second dielectric aperture to partially fill the first and second dielectric apertures. The first photosensitive material is removed to reveal at least one framed via hole including a raised ring of the first metal layer that is around the via hole. This raised ring will be the barrier ring in the final build-up layer structure.

A second metal layer is plated on the first metal layer in the via hole, where the second metal layer has a smaller cross sectional area throughout its thickness as compared to a cross sectional area of the first metal layer throughout its thickness. A dielectric layer is formed that surrounds the first metal layer and the second metal layer, wherein a top surface of the dielectric layer is planar with respect to a top surface of the second metal layer to provide a build-up layer with a planarized surface having a filled via hole. This method can be repeated a plurality of times to provide a package substrate having a plurality of build-up layers that can optionally each include disclosed barrier rings in their dielectric layer.

Figure 3A:
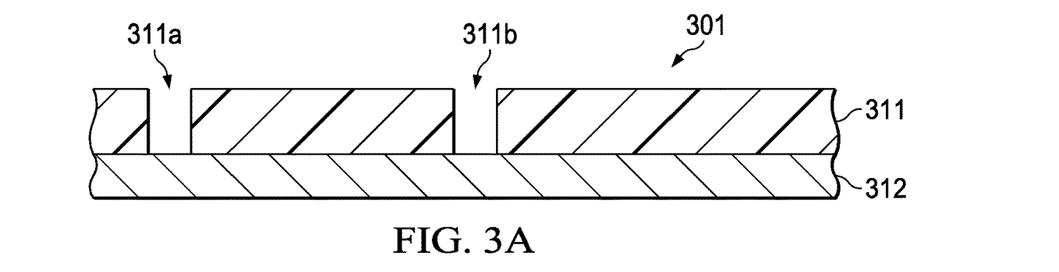
FIGS. 3A-G are cross sectional views of an example in-process package substrate corresponding to steps in an example assembly process that includes forming a disclosed barrier ring at the high stress corner of the microvia, according to an example aspect.
Figure 3B:
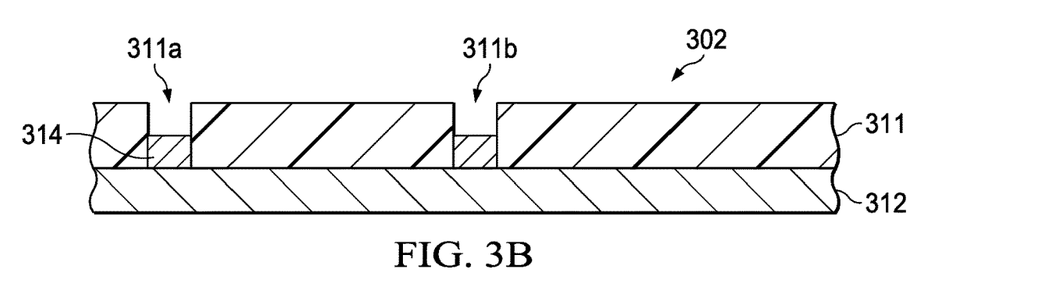
Figure 3C:
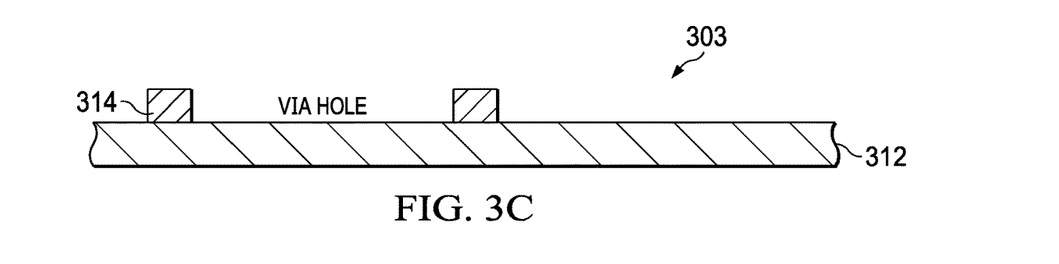

FIGS. 3A-G are cross sectional views of an example in-process package substrate corresponding to steps in a first example assembly process that includes forming a disclosed barrier ring at the high stress corner of the microvia, according to an example aspect. FIG. 3A shows the in-process packaged device after step 301 comprising forming a patterned first photosensitive material layer 311 having a first dielectric aperture 311a and a second dielectric aperture 311b on a metal core layer 312. FIG. 3B shows the in-process packaged device after step 302 comprising plating a first metal layer 314 into the first dielectric aperture 311a and the second dielectric aperture 311b to partially fill the first and second dielectric apertures. FIG. 3C shows the in-process packaged device after step 303 comprising removing the first photosensitive material 311 to reveal at least one framed via hole including a raised ring of the first metal layer 314 that is around the via hole. This raised ring will be the barrier ring in the final build-up layer structure.

Figure 3D:
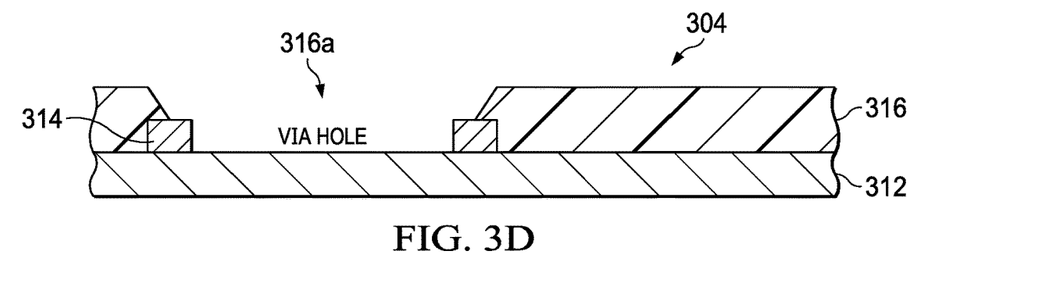

FIG. 3D shows the in-process packaged device after step 304 comprising patterning with a second photosensitive material 316 to form a patterned layer of the photosensitive material 316 (e.g., a DFR layer) that has an aperture 316a with a tapered shape at the edge which overlaps with ring structure 314 defined by the first metal layer to enable in a next step plating of a metal in the via hole. The tapered edged can be formed by precision mask design that enables proper registration between the photosensitive material 316 and the ring structure 314.

Figure 3E:
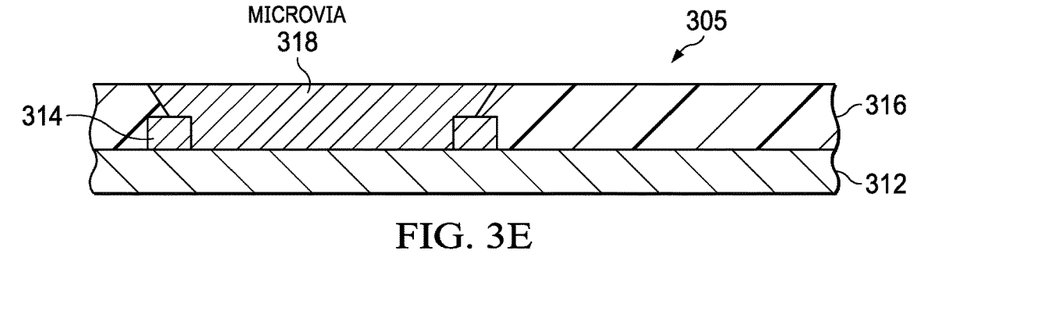
Figure 3F:
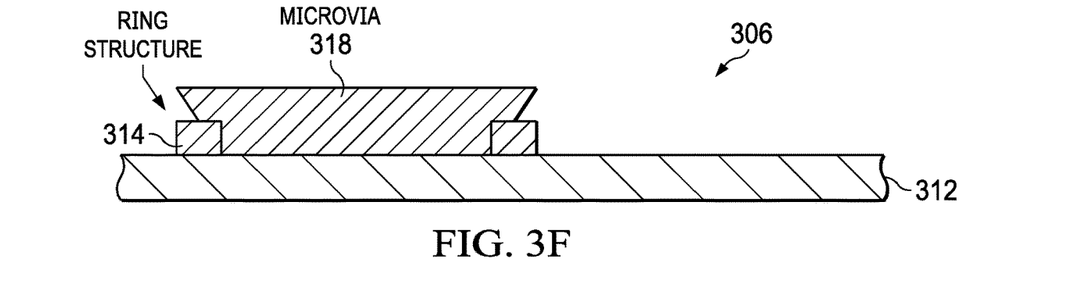
Figure 3G:
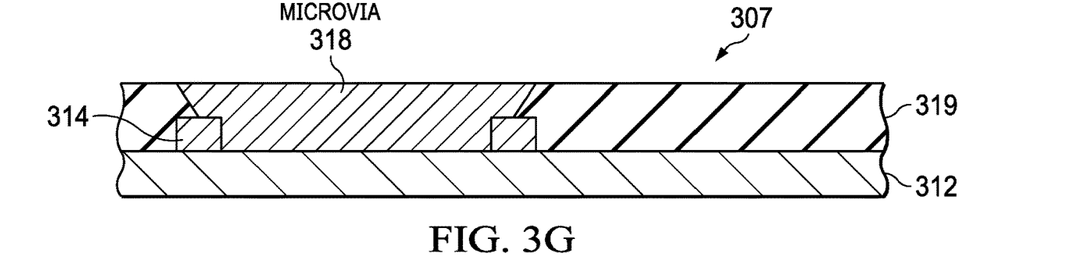

FIG. 3E shows the in-process packaged device after step 305 comprising plating a second metal layer to form a microvia 318 on the ring structure 314 in the via hole, where the microvia 318 has a smaller outer dimension (e.g., a diameter) throughout its thickness as compared to an outer dimension of the ring structure 314 throughout its thickness. FIG. 3F shows the in-process packaged device after step 306 comprising removing the photosensitive material 316, and FIG. 3G shows the in-process packaged device after step 307 comprising forming a dielectric layer that surrounds the ring structure 314 and the microvia 318, wherein a top surface of the dielectric layer 319 is planar with respect to a top surface of the microvia 318 to provide a build-up layer with a planarized surface having a filled via with a disclosed barrier ring provided by the ring structure 314.

This method can be repeated a plurality of times to provide a package substrate having a plurality of build-up layers that can each include disclosed barrier rings in their dielectric layer. The barrier ring can be 2 μm to 8 μm thick and have an outer diameter that is at least 10% greater than a diameter of its associated microvia that it protects the region around.

Figure 4A:
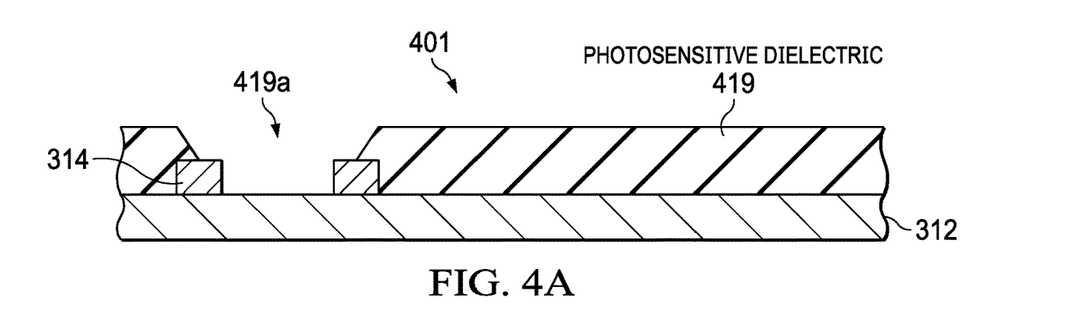
FIGS. 4A-B are cross sectional views of an example in-process package substrate corresponding to steps in another example assembly process that includes forming a disclosed barrier ring at the high stress corner of the microvia beginning with the in-process structure shown in FIG. 3C, according to an example aspect.
Figure 4B:
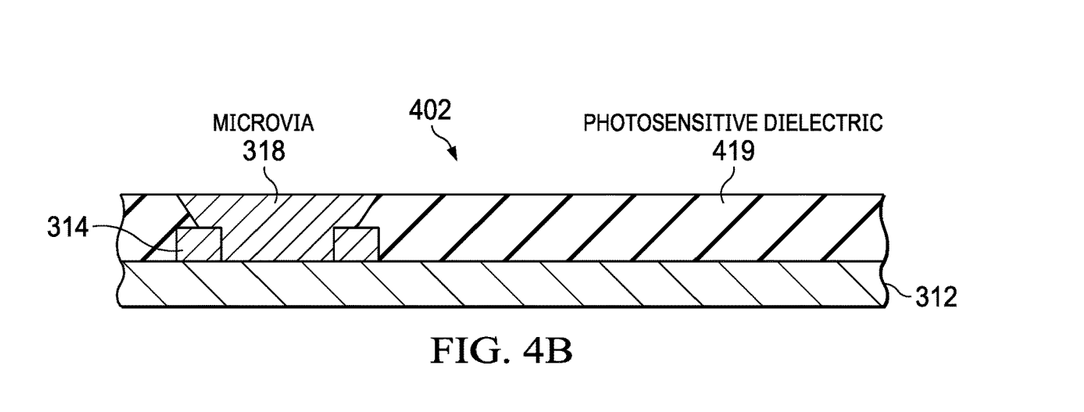

FIGS. 4A-B are cross sectional views of an example in-process package substrate corresponding to steps in another example assembly process beginning with the in-process structure shown in FIG. 3C, according to an example aspect. In this method, a photosensitive dielectric layer 419 is added before the plating of the second metal layer that forms the microvia 318, and the forming of the photosensitive dielectric layer 419 includes forming an aperture 419a to provide a pattern opening having the tapered shape over the framed via hole. This method can utilize steps 301-303 described above and thus begin with the in-process device after step 303 comprising removing the first photosensitive material 311 to reveal at least one framed via hole including a raised ring 314 of the first metal layer that is around the via hole.

FIG. 4A shows the in-process packaged device after step 401 comprising forming the photosensitive dielectric layer 419 with an aperture 419a to provide a pattern opening having the tapered shape over the framed via hole defined by raised ring 314. The photosensitive dielectric layer 419 can comprise an epoxy-based material with a photo-initiator added to provide photo-sensitivity. FIG. 4B shows the in-process packaged device after step 402 comprising plating a second metal layer to form a microvia 318 on the raised ring 314 and in the via hole, where the microvia 318 has a smaller outer dimension (e.g., a diameter) throughout its thickness as compared to an outer dimension of the raised ring 314 throughout its thickness. A top surface of the photosensitive dielectric layer 419 is planar with respect to a top surface of the microvia 318 to provide a build-up layer with a planarized surface having a filled via with a disclosed barrier ring provided by the raised ring 314. This method can be repeated a plurality of times to provide a package substrate having a plurality of build-up layers that can each include disclosed barrier rings in their dielectric layer.

Figure 5A:
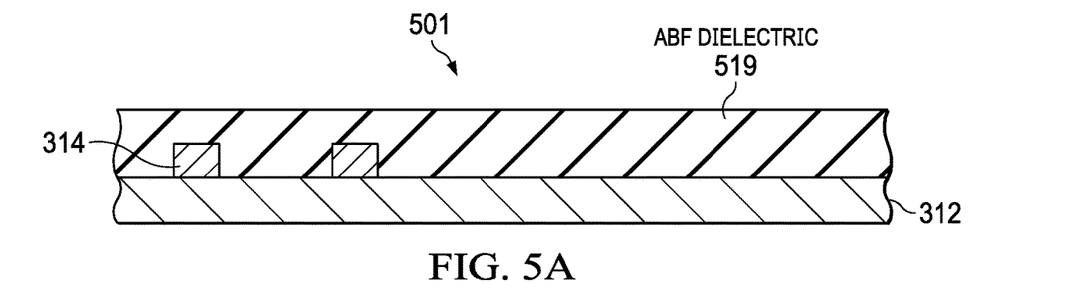
FIGS. 5A-C are cross sectional views of an example in-process package substrate corresponding to steps in yet another example assembly process that includes forming a disclosed barrier ring at the high stress corner of the microvia again beginning with the in-process structure shown in FIG. 3C, according to an example aspect.
Figure 5B:
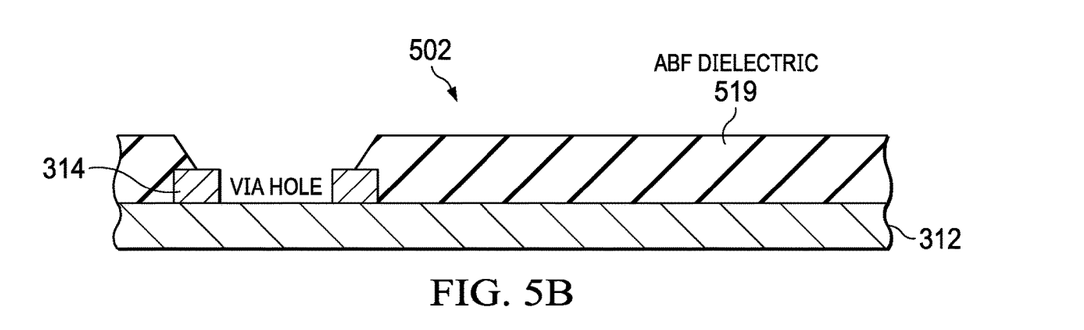
Figure 5C:
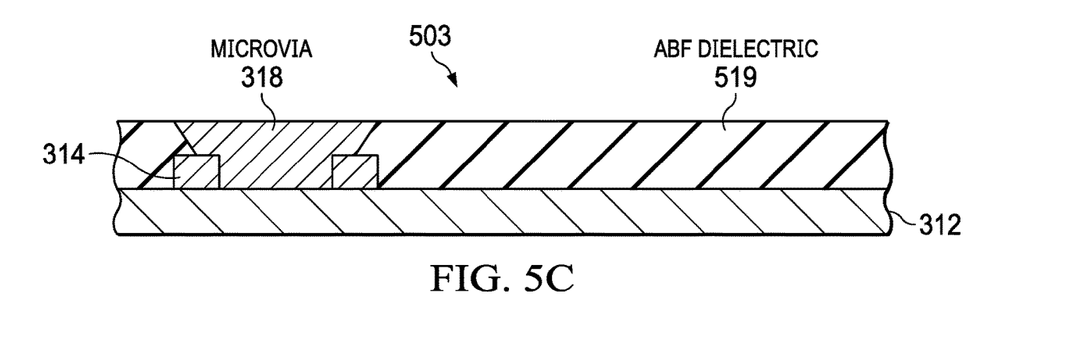

FIGS. 5A-C are cross sectional views of an example in-process package substrate corresponding to steps in another example assembly process, again beginning with the in-process structure shown in FIG. 3C, according to an example aspect. In this method a dielectric layer is formed before the plating of the second metal layer that forms the microvia, and the forming of the dielectric layer comprises forming a dielectric laminate layer (such as ABF). FIG. 5A shows the in-process packaged device after step 501 comprising forming a dielectric laminate layer shown by example as an ABF dielectric layer 519 over the in-process package device structure shown in in FIG. 3C including over the framed via hole defined by raised ring 314. FIG. 5B shows the in-process packaged device after step 502 comprising laser drilling an aperture in the ABF dielectric layer 519 to provide the pattern opening having the tapered shape over the framed via hole. FIG. 5C shows the in-process packaged device after step 503 comprising plating a second metal layer to form the microvia 318 into the via hole. As before, a top surface of the ABF dielectric layer 519 is planar with respect to a top surface of the microvia 318 to provide a build-up layer with a planarized surface having a filled via with a disclosed barrier ring 314. This method can be repeated a plurality of times to provide a package substrate having a plurality of build-up layers that can each include disclosed barrier rings in their dielectric layer.

Disclosed aspects can be integrated into a variety of assembly flows to form a variety of different semiconductor integrated circuit (IC) devices and related products. The assembly can comprise single semiconductor die or multiple semiconductor die, such as configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A method of fabricating a multi-layer package substrate, comprising:
    forming a first build-up layer including a first dielectric layer and at least a second build-up layer including a second dielectric layer on the first build-up layer, wherein the second build-up layer includes a top metal surface that is configured for attaching at least one integrated circuit (IC) die;
    wherein the first build-up layer includes a first tapered microvia extending through the first dielectric layer and the second build-up layer includes at least a second tapered microvia extending through the second dielectric layer that is coupled to the first microvia;
    further comprising a barrier ring having a coefficient of thermal expansion (CTE) matching material relative to a metal of the second tapered microvia positioned along only a portion of a height of at least the second tapered microvia along a smallest diameter of the second tapered microvia, the barrier ring directly connected to the metal of the second tapered microvia.

2. The method of claim 1, wherein the CTE matching material has a CTE that is within 5 ppm/° C. of a CTE of the metal of the second tapered microvia.

3. The method of claim 1, wherein the CTE matching material and the second tapered microvia both comprise a same material.

4. The method of claim 1, wherein the first dielectric layer and the second dielectric layer both comprise an organic dielectric polymer.

5. The method of claim 1, wherein the barrier ring is positioned within 10 millimeters under at least one outer edge of the IC die.

6. The method of claim 1, wherein the barrier ring is 2 μm to 8 μm thick and has an outer diameter that is at least 10% greater than an outer diameter of the second tapered microvia.

7. The method of claim 1, further providing a core that the first and second build-up layers are on.

8. A method of fabricating a packaged integrated circuit (IC) device, comprising:
    providing at least one IC die, and
    providing a package substrate comprising:
    a first build-up layer including a first dielectric layer and at least a second build-up layer including a second dielectric layer on the first build-up layer, wherein the second build-up layer includes a top metal surface that is configured for attaching the IC die;
    wherein the first build-up layer includes a first tapered microvia extending through the first dielectric layer and the second build-up layer includes at least a second tapered microvia extending through the second dielectric layer that is coupled to the first tapered microvia; further comprising a barrier ring having a coefficient of thermal expansion (CTE) matching material relative to a CTE of a metal of the second tapered microvia positioned along only a portion of a height of at least the second tapered microvia along a smallest diameter of the second tapered microvia, the barrier ring directly connected to the metal of the second tapered microvia.

9. The method of claim 8, wherein the CTE matching material has a CTE that is within 5 ppm/° C. of a CTE of the metal of the second tapered microvia.

10. The method of claim 8, wherein the barrier ring is 2 μm to 8 μm thick and has an outer diameter that is at least 10% greater than an outer diameter of the second tapered microvia.

11. The method of claim 8, wherein the CTE matching material and the second tapered microvia both comprise a same material.

12. The method of claim 10, wherein the CTE matching material has a CTE that is within 5 ppm/° C. of a CTE of the metal of the second tapered microvia.

13. The method of claim 9, wherein the barrier ring is 2 μm to 8 μm thick and has an outer diameter that is at least 10% greater than an outer diameter of the second tapered microvia.

14. The method of claim 9, wherein the CTE matching material and the second tapered microvia both comprise a same material.

15. The method of claim 10, wherein the CTE matching material and the second tapered microvia both comprise a same material.

16. The method of claim 8, wherein the first dielectric layer and the second dielectric layer both comprise an organic dielectric polymer.

17. The method of claim 8, wherein the barrier ring is positioned within 10 millimeters under at least one outer edge of the IC die.

18. The method of claim 8, further comprising a core that the first and second build-up layers are on.

19. The method of claim 7, wherein the core comprises organic material.

* * * * *